(12) United States Patent
Hill et al.

(10) Patent No.: US 12,525,944 B2
(45) Date of Patent: *Jan. 13, 2026

(54) ACOUSTIC WAVE DEVICE WITH WURTZITE BASED PIEZOELECTRIC LAYER WITH HIGH ACOUSTIC VELOCITY

(71) Applicant: Skyworks Global Pte. Ltd., Singapore (SG)

(72) Inventors: Michael David Hill, Emmitsburg, MD (US); Alexandre Augusto Shirakawa, Cardiff by the Sea, CA (US); Benjamin Paul Abbott, Irvine, CA (US); Stefan Bader, Fort Collins, CO (US); David Albert Feld, Los Altos, CA (US); Kwang Jae Shin, Yongin (KR)

(73) Assignee: Skyworks Global Pte. Ltd., Singapore (SG)

( * ) Notice: Subject to any disclaimer, the term of this patent is extended or adjusted under 35 U.S.C. 154(b) by 287 days.

This patent is subject to a terminal disclaimer.

(21) Appl. No.: 18/193,424

(22) Filed: Mar. 30, 2023

(65) Prior Publication Data

US 2023/0327635 A1 Oct. 12, 2023

Related U.S. Application Data

(60) Provisional application No. 63/362,264, filed on Mar. 31, 2022, provisional application No. 63/362,257, filed on Mar. 31, 2022.

(51) Int. Cl.
*H03H 9/02* (2006.01)
*C01B 32/907* (2017.01)
(Continued)

(52) U.S. Cl.
CPC ....... *H03H 9/02031* (2013.01); *C01B 32/907* (2017.08); *H03H 9/02015* (2013.01);
(Continued)

(58) Field of Classification Search
None
See application file for complete search history.

(56) References Cited

U.S. PATENT DOCUMENTS

2005/0093648 A1* 5/2005 Inoue ............... H03H 9/706
333/133
2009/0123259 A1 5/2009 Barclay et al.
(Continued)

OTHER PUBLICATIONS

Jenkins et al., "Growth of solid solutions of aluminum nitride and silicon carbide by metalorganic chemical vapor deposition", Journal of Crystal Growth, 1993, 128: 375-378.
(Continued)

*Primary Examiner* — Lester G Kincaid
(74) *Attorney, Agent, or Firm* — Knobbe, Martens, Olson & Bear, LLP

(57) ABSTRACT

Aspects of this disclosure relate to an acoustic wave device with a piezoelectric layer that includes a wurtzite structure. The wurtzite structure can include a group 2 element and have a high acoustic velocity. For example, the wurtzite structure can include a carbide and the group 2 element can be carbon of the carbide. The high acoustic velocity can be over 10,000 meters per second. Related piezoelectric layers, acoustic wave filters, radio frequency modules, wireless communication devices, and methods are disclosed.

20 Claims, 8 Drawing Sheets

(51) Int. Cl.
*H03H 9/17* (2006.01)
*H03H 9/25* (2006.01)
*H03H 9/56* (2006.01)
*H03H 9/64* (2006.01)

(52) U.S. Cl.
CPC .... *H03H 9/02543* (2013.01); *H03H 9/02834* (2013.01); *H03H 9/173* (2013.01); *H03H 9/176* (2013.01); *H03H 9/25* (2013.01); *H03H 9/568* (2013.01); *H03H 9/6483* (2013.01); *C01P 2002/52* (2013.01); *C01P 2006/40* (2013.01)

(56) References Cited

U.S. PATENT DOCUMENTS

| | | | | |
|---|---|---|---|---|
| 2011/0115571 | A1* | 5/2011 | Nakamura | H04L 27/36 332/105 |
| 2015/0326200 | A1* | 11/2015 | Grannen | H03H 9/02102 310/346 |
| 2020/0099359 | A1 | 3/2020 | Shin et al. | |
| 2020/0177157 | A1 | 6/2020 | Nakagawa et al. | |
| 2020/0358464 | A1* | 11/2020 | Abbott | H03H 9/6406 |
| 2021/0159874 | A1* | 5/2021 | Yang | H03H 9/568 |
| 2021/0203402 | A1* | 7/2021 | Shealy | H03H 9/105 |
| 2021/0265971 | A1* | 8/2021 | Knapp | H03H 9/02574 |
| 2021/0296566 | A1* | 9/2021 | Koutsaroff | H03H 9/02543 |
| 2022/0037580 | A1* | 2/2022 | Nakamura | H10N 30/708 |
| 2022/0060166 | A1 | 2/2022 | Yantchev | |
| 2022/0182034 | A1* | 6/2022 | Moe | H03H 9/02015 |
| 2023/0353119 | A1 | 11/2023 | Hill et al. | |
| 2024/0136998 | A1* | 4/2024 | Burak | H03H 9/54 |

OTHER PUBLICATIONS

Liljeholm et al., "Synthesis and characterization of (0001)-textured wurtzite $Al_{1-x}B_xN$ thin films", Surface and Coatings Technology, 2011, 206: 1033-1036.
Song et al., "Surface acoustic wave device properties of (B, Al)N films on 128° Y-X LiNbOs substrate", Applied Surface Science, 2010, 256: 7156-7159.
Tasnadi et al., "Significant configurational dependence of the electromechanical coupling constant of $B_{0.125}Al_{0.875}N$", Applied Physics Letters, 2009, 94, in 3 pages.
Witthaut et al., "Characterization of ternary Al—B—N films", Thin Solid Films, 2000, 377-378, pp. 478-483.
U.S. Appl. No. 18/193,317, filed Mar. 30, 2023, Acoustic Wave Device With Wurtzite Based Piezoelectric Layer.
Boguslawski, "Doping properties of C, Si, and Ge impurities in GaN and AlN", Physical Review B, vol. 56(15):9496-9505 (1997).
Burton et al., "First principles phase diagram calculations for the wurtzite-structure quasibinary systems SiC—AiN, SiC—GaN and SiC—InN", Journal of Applied Physics, vol. 110:023507-1-023507-8 (2011).
Davis et al., Annual Report, "Low-temperature deposition and characterization of N- and P-Type silicon carbide thin films and associated ohmic and schottky contacts", Office of the Chief Naval Research, Report for the period Jan. 1, 1992-Dec. 31, 1992, in 66 pages.
Davis et al., "Final Technical Report: Pseudomorphic semiconducting heterostructures from combinations of AlN, GaN and selected SiC polytypes: Theoretical advancement and its coordination with experimental studies of nucleation, growth, characterization and device development", Materials Science and Engineering Department, North Carolina State University, Raleigh, NC, report for the period Jul. 1, 1995-Dec. 31, 1995, in 72 pages.
Gu et al., "Aluminum nitride-silicon carbide alloy crystals grown on SiC substrates by sublimation", MRS Internet J. Nitride Semicond. Res. vol. 10(5):1-8 (2005).
Jenkins et al., "Growth of solid solutions of aluminum nitride and silicon carbide by metalorganic chemical vapor deposition", Materials Science Research Center of Excellence, Department of Electrical Engineering, School of Engineering, Howard University, Washington DC, in 13 pages, (1992).
Kern et al., "Solid solutions of AlN and SiC grown by plasma-assisted, gas-source molecular beam epitaxy," J. Matter Res., vol. 7, No. 7, Jul. 1993.
Luo et al., "First-principles study of wurtzite $BC_2N$", Physical Review B, vol. 76:092107-1-4 (2007).
Pedesseau et al., "$Al_4SiC_4$ wurtzite crystal: Structural, optoelectronic, elastic, and piezoelectric properties", APL Materials, vol. 3:121101-8 (2015).
Rais-Zadeh et al., "Gallium nitride as an electromechanical material", Journal of Microelectromechanical Systems, vol. 23(6):1252-1271 (2014).
Ramazanov et al., "Structural properties of the epitaxial $(SiC)_{1-x}(AlN)_x$ solid solution films fabricated by magnetron sputtering of SiC—Al composite targets", Technical Physics Letters, vol. 40(4):300-302 (2014).
Rowland et al., "Epitaxial Growth of AlN by Plasma-Assisted Gas-Source Molecular Beam Epitaxy," Nov. 1992.
Xie et al., "Growth and electrical characterization of Al—N co-doping SiC single crystals", IEEE, in 4 pages (2017).
Zangvil et al., "Phase relationships in the silicon carbide-aluminum nitride system", J. Am. Ceram. Soc., vol. 71(10):884-890 (1988).

* cited by examiner

ACOUSTIC WAVE DEVICE WITH WURTZITE BASED PIEZOELECTRIC LAYER WITH HIGH ACOUSTIC VELOCITY

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/362,257, filed Mar. 31, 2022 and titled "ACOUSTIC WAVE DEVICE WITH WURTZITE BASED PIEZOELECTRIC LAYER," and U.S. Provisional Application No. 63/362,264, filed Mar. 31, 2022 and titled "ACOUSTIC WAVE DEVICE WITH WURTZITE BASED PIEZOELECTRIC LAYER WITH HIGH ACOUSTIC VELOCITY," the disclosures of each of which are hereby incorporated by reference in their entireties and for all purposes.

BACKGROUND

Technical Field

The disclosed technology relates to acoustic wave devices and/or piezoelectric films. Embodiments of this disclosure relate to acoustic wave devices with a wurtzite based piezoelectric layer.

Description of Related Technology

An acoustic wave filter can include a plurality of acoustic wave resonators arranged to filter a radio frequency signal. Example acoustic wave resonators include surface acoustic wave (SAW) resonators and bulk acoustic wave (BAW) resonators. A SAW resonator can include an interdigital transducer electrode on a piezoelectric substrate. The SAW resonator can generate a surface acoustic wave on a surface of the piezoelectric layer on which the interdigital transducer electrode is disposed. In BAW resonators, acoustic waves propagate in the bulk of a piezoelectric layer. Example BAW resonators include film bulk acoustic wave resonators (FBARs) and BAW solidly mounted resonators (SMRs).

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

An acoustic wave device can include piezoelectric layer. Properties of the piezoelectric layer can impact performance of the acoustic wave device. For example, in a BAW device, a material of the piezoelectric layer and thickness of the piezoelectric layer can impact a resonant frequency of the BAW device.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave device that includes a piezoelectric layer and an electrode over the piezoelectric layer. The piezoelectric layer includes a wurtzite structure. The wurtzite structure includes aluminum nitride and silicon carbide. The acoustic wave device is configured to generate an acoustic wave.

The piezoelectric layer can have an acoustic velocity of at least 10,000 meters per second. The acoustic velocity can be less than 15,000 meters per second.

The piezoelectric layer can include a dopant.

The acoustic wave device can be a bulk acoustic wave device, and the acoustic wave can be a bulk acoustic wave. Such a bulk acoustic wave device can have a resonant frequency of at least 6 gigahertz. The resonant frequency can be in a range from 6 gigahertz to 15 gigahertz.

The acoustic wave device can be a surface acoustic wave device, and the acoustic wave can be a surface acoustic wave.

The piezoelectric layer can include, consist, or consist essentially of a material in a AlN—SiC material system. The piezoelectric layer can include, consist, or consist essentially of a material in a AlN—SiC—C material system. The piezoelectric layer can include, consist, or consist essentially of a material in a AlN—SiC—BN material system. The piezoelectric layer can include, consist, or consist essentially of a material in a AlN—SiC—BN—C material system. The piezoelectric layer can include, consist, or consist essentially of a material in a AlN—SiC—ScN material system. The piezoelectric layer can include, consist, or consist essentially of a material in a AlN—SiC—ScN—C material system. The piezoelectric layer can include, consist, or consist essentially of a material in a AlN—SiC-½MgSiN2 material system. The piezoelectric layer can include, consist, or consist essentially of a material in a AlN—SiC-½MgSiN2-C material system.

Another aspect of this disclosure is a piezoelectric film that includes a wurtzite structure. The wurtzite structure includes aluminum nitride and silicon carbide.

Another aspect of this disclosure is an acoustic wave device that includes a piezoelectric layer and an electrode over the piezoelectric layer. The piezoelectric layer includes a wurtzite structure that includes a period 2 element. The piezoelectric layer has an acoustic velocity of at least 10,000 meters per second. The acoustic wave device is configured to generate an acoustic wave.

The wurtzite structure can further include aluminum nitride.

The wurtzite structure can include a carbide, in which the period 2 element is carbon of the carbide. The wurtzite structure can further include aluminum nitride.

The wurtzite structure can include silicon carbide, in which the period 2 element is carbon of the silicon carbide. The piezoelectric layer can include $Al_4SiC_4$.

The period 2 element can be boron. The piezoelectric layer can include, consist, or consist essentially of a B—Al—N material system.

The piezoelectric layer can include a dopant.

The acoustic velocity can be no greater than 15,000 meters per second.

The acoustic wave device can be a bulk acoustic wave device, and the acoustic wave can be a bulk acoustic wave. Such a bulk acoustic wave device has a resonant frequency in a range from 6 gigahertz to 15 gigahertz.

The acoustic wave device can be a surface acoustic wave device, and the acoustic wave can be a surface acoustic wave.

Another aspect of this disclosure is a piezoelectric film including a wurtzite structure that includes a period 2 element. The piezoelectric layer has an acoustic velocity of at least 10,000 meters per second.

The wurtzite structure can include a carbide, in which the period 2 element is carbon of the carbide. Alternatively, the period 2 element can be boron.

The wurtzite structure can further include aluminum nitride.

The acoustic velocity can be less than 15,000 meters per second.

Another aspect of this disclosure is an acoustic wave filter that includes an acoustic wave device in accordance with any suitable principles and advantages disclosed herein and a plurality of additional acoustic wave devices. The acoustic wave filter is configured to filter a radio frequency signal.

Another aspect of this disclosure is a radio frequency module that includes an acoustic wave filter and radio frequency circuitry coupled to the radio frequency filter. The acoustic wave filter that includes an acoustic wave device in accordance with any suitable principles and advantages disclosed herein. The acoustic wave filter and the radio frequency circuitry are enclosed within a common package.

Another aspect of this disclosure is a wireless communication device that includes an acoustic wave filter, an antenna operatively coupled to the acoustic wave filter, a radio frequency amplifier operatively coupled to the acoustic wave filter and configured to amplify a radio frequency signal, and a transceiver in communication with the radio frequency amplifier. The acoustic wave filter that includes an acoustic wave device in accordance with any suitable principles and advantages disclosed herein.

Another aspect of this disclosure is a method of filtering a radio frequency signal, the method includes receiving a radio frequency signal at a port of an acoustic wave filter that includes an acoustic wave device in accordance with any suitable principles and advantages disclosed herein; and filtering the radio frequency signal with the acoustic wave filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 18/193,317, titled "ACOUSTIC WAVE DEVICE WITH WURTZITE BASED PIEZOELECTRIC LAYER," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
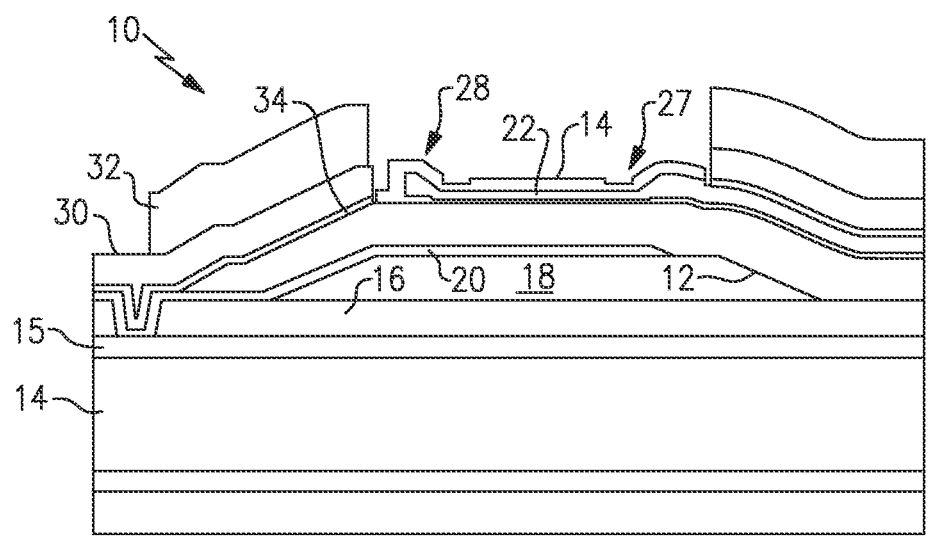
FIG. 1A is a cross sectional diagram of a bulk acoustic wave (BAW) device according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. Any suitable principles and advantages of the embodiments disclosed herein can be implemented together with each other.

Certain bulk acoustic wave (BAW) devices can include a piezoelectric layer that includes scandium doped aluminum nitride. Such BAW devices can be included in acoustic wave filters for handset applications. A piezoelectric material can be selected for a particular application based on the acoustic velocity of a sound wave within the piezoelectric material. A piezoelectric material with higher acoustic velocity can enable higher frequency BAW operation than another piezoelectric material with a lower acoustic velocity. The acoustic velocity can be a function of the elastic constant and the density according to Equation 1:

$$v = (K/\rho)^{1/2} \quad \text{(Equation 1)}$$

In Equation 1, v represents acoustic velocity, K represents the bulk modulus of a piezoelectric material and $\rho$ represents density of the piezoelectric material.

Undoped aluminum nitride (AlN) with a wurtzite crystal structure has a sound velocity of approximately 11,000 meter/second (m/s). This can make undoped aluminum nitride suitable for BAW devices with a resonant frequency of up to around 6 gigahertz (GHz). Scandium (Sc) can be used as a dopant in an aluminum nitride piezoelectric layer of a BAW device to improve the electromechanical coupling coefficient. This can consequently increase bandwidth of a filter that includes such a BAW device. The addition of scandium can both increase the density and decrease the elastic modulus, causing the acoustic velocity to drop to values below 9000 m/s, depending on scandium concentration. Such piezoelectric layer doping can restrict the frequency range of use for BAW devices. With a lower acoustic velocity of a piezoelectric layer, a BAW device can have a lower resonant frequency when a BAW stack is otherwise the same.

For higher frequency applications, such as applications greater than 6 GHz, it can be desirable to use a piezoelectric material having a higher acoustic velocity than aluminum nitride. To increase the acoustic velocity of a material relative to aluminum nitride, stronger covalent bonds (e.g., Si, C, or B) can be formed in a material with a reduced density, while maintaining a wurtzite structure.

One material with stronger covalent bonds is the wurtzite silicon carbide (SiC). A wurtzite structure is a hexagonal non-centrosymmetric atomic arrangement. The wurtzite structure is the typical structural arrangement for the piezoelectric materials zinc oxide and aluminum nitride. The structures disclosed herein can be wurtzite crystal structures. Wurtzite 4H SiC can have an acoustic velocity of 13,100 m/s. However, although wurtzite silicon carbide is piezoelectric, its relatively low piezoelectric constants and small electromechanical coupling coefficient make pure SiC typically undesirable for BAW filter applications. AlN and SiC can form a continuous solid solution with a stoichiometric formula of $(SiC)_{1-x}(AlN)_x$, where $0<x<1$. There is a complete 2H solid state solution for AlN—SiC for relatively high temperatures. Films with such a wurtzite structure can be deposited via metalorganic chemical vapor deposition (CVD), molecular beam epitaxy (MBE), or magnetron sputtering where such films have a composition range with $0.1<x<0.9$. Such deposition processes can help avoid thermodynamic immiscibility in such materials, similar to avoiding immiscibility in scandium doped aluminum nitride films.

Wurtzite AlN—SiC can be formed by a variety of methods. Magnetron sputtered AlN—SiC films can be formed by sputtering SiC targets and Al metal on a 6H—SiC substrate in a mix of nitrogen and argon. Such films can have a thickness in a range from 0.2 to 1.3 microns. These films can form over the complete solid solution range. AlN—SiC films can be formed by sublimation growth. Relatively high purity blends of SiC and AlN powders can be grown in relatively high purity nitrogen gas. Growth can occur in a temperature range from 1800° C. to 2000° C. The material can be grown can be onto 6H and 4H—SiC based substrates. The dislocation density in crystal near the substrate can be about $10^{10}$ cm$^{-2}$ and away from substrate dislocation density can be about 108 cm$^{-2}$. MBE is another method of forming films with a AlN—SiC wurtzite structure. Calculated phase diagrams for AlN—SiC indicate that alternating AlN and SiC layers can be formed suggesting that a variety of complex interlayer piezoelectric structures may be formed.

A piezoelectric layer of an acoustic wave device, such as a BAW device, can include a $(SiC)_{1-x}(AlN)_x$ solid solution region material. Such a piezoelectric layer can incorporate additional carbon and maintain a wurtzite structure. Similarly, a piezoelectric layer with a SiC—AlN system can incorporate additional silicon and maintain a wurtzite structure. An ionic element, such as magnesium (Mg), can also be included to improve the coupling coefficient. The piezoelectric layer can also be alloyed with low density boron nitride (BN) that has strong covalent bonds.

Piezoelectric layers disclosed herein can have increased acoustic velocities relative to doped aluminum nitride piezoelectric layers and/or undoped aluminum nitride piezoelectric layers. Accordingly, BAW devices including such piezoelectric layers can have increased operating frequencies in certain applications. Alternatively or additionally, BAW devices including such piezoelectric layers can have thicker piezoelectric layers for a same resonant frequency, which can improve one or more of thermal dissipation, power handling, or manufacturability (e.g., reduced process variations and/or increased yields). BAW devices with piezoelectric layers disclosed herein can have lower power density than BAW devices with aluminum nitride piezoelectric layers or scandium doped aluminum nitride piezoelectric layers.

Example piezoelectric layers disclosed herein can include aluminum nitride and silicon carbide. Such a piezoelectric layer can include one of the following material systems: AlN—SiC, AlN—SiC—C, AlN—SiC—BN, AlN—SiC—ScN, AlN—SiC-½MgSiN$_2$, AlN—SiC—BN—C, AlN—SiC—ScN—C, or AlN—SiC-½MgSiN$_2$—C. BAW resonators including such a piezoelectric layer can achieve a desirable electromechanical coupling factor and a desirable quality factor (Q). At the same time, such BAW devices can operate at a higher frequency relative to a scandium doped aluminum nitride piezoelectric layer having the same thickness. Alternatively, a BAW device can include a thicker piezoelectric layer with a higher acoustic velocity compared to the thickness of a thinner piezoelectric layer with a lower acoustic velocity and the same resonant frequency.

Example piezoelectric layers disclosed herein can have a wurtzite structure that includes a period 2 element and a high acoustic velocity. Such a piezoelectric layer can include a B—Al—N material system, any of the material systems that include AlN and SiC mentioned in the preceding paragraph, BC$_2$N, or Al$_4$SiC. In some of these example piezoelectric layers, the wurtzite structure includes a carbide. The piezoelectric layer can include aluminum nitride. The piezoelectric layer can include a dopant. The dopant can increase the electrotechnical coupling coefficient of the piezoelectric layer. The high acoustic velocity can be higher than the acoustic velocity of a doped aluminum nitride layer, such as a scandium doped aluminum nitride layer. The high acoustic velocity can be higher than the acoustic velocity of an undoped aluminum nitride layer in certain applications. The high acoustic velocity can be at least 10,000 meters per second. A period 2 element is an element in the second row of the periodic table of the elements. The period 2 element can be carbon. The period 2 element can be boron.

Piezoelectric layers disclosed herein can be implemented in acoustic wave devices. For example, piezoelectric layers disclosed herein can be implemented in BAW devices, such as film bulk acoustic wave resonators (FBARs) and BAW solidly mounted resonators (SMRs). As another example, piezoelectric layers disclosed herein can be implemented in surface acoustic wave (SAW) devices, such as non-temperature compensated SAW devices, temperature compensated SAW (TC SAW) devices, and multilayer piezoelectric substrate (MPS) SAW devices. As one more example, piezoelectric layers disclosed herein can be implemented in Lamb wave elements, such as Lamb wave resonators and Lamb wave delay lines. As one more example, piezoelectric layers disclosed herein can be implemented in boundary wave resonators. Example acoustic wave devices will now be discussed. Any suitable principles and advantages disclosed herein can be implemented in any of these example acoustic wave devices.

The piezoelectric layers disclosed herein can be implemented in BAW devices. In BAW devices, a piezoelectric layer having a higher acoustic velocity can contribute to a higher resonant frequency for a given piezoelectric layer thickness. A BAW device with a piezoelectric layer in accordance with any suitable principles and advantages disclosed herein can have a resonant frequency of at least 6 GHz. A BAW device with a piezoelectric layer in accordance with any suitable principles and advantages disclosed herein can have a resonant frequency in a range from 6 GHz to 15 GHz. In some of these instances, a BAW device can have a resonant frequency in a range from 6 GHz to 10 GHz. A BAW device with a thicker piezoelectric layer with a higher acoustic velocity can have a same resonant frequency as another BAW device with a thinner piezoelectric layer and a lower acoustic velocity. BAW resonators, such as FBARs and BAW SMRs, can include piezoelectric layers in accordance with any suitable principles and advantages disclosed herein. An example of such a BAW resonator will be discussed with reference to FIG. 1A.

FIG. 1A is a cross sectional diagram of a BAW device 10 according to an embodiment. The BAW devices 10 includes a piezoelectric layer 12. The piezoelectric layer 12 includes a wurtzite crystal structure. The piezoelectric layer 12 can have a high acoustic velocity. The high acoustic velocity can be at least 9,000 m/s. The high acoustic velocity can be at least 10,000 m/s. The high acoustic velocity can be at least 11,000 m/s. The high acoustic velocity can be at least 12,000 m/s. The high acoustic velocity can be higher than an acoustic velocity of an aluminum nitride piezoelectric film doped with scandium. The high acoustic velocity can be higher than an acoustic velocity of an undoped aluminum nitride piezoelectric film. The high acoustic velocity can be less than 15,000 m/s. The high acoustic velocity can be less than 13,100 m/s. The high acoustic velocity can be less than an acoustic velocity of a silicon carbide wurtzite crystal structure.

The piezoelectric layer 12 can have a high acoustic velocity and include a wurtzite crystal structure that includes a period 2 element. The period 2 element can be carbon. The period 2 element can be boron. The piezoelectric layer 12 can include a wurtzite structure that includes a period 2 element and aluminum nitride. The piezoelectric layer 12 can include a wurtzite structure that includes a carbide. The piezoelectric layer 12 can include a wurtzite structure that includes a carbide and aluminum nitride.

The piezoelectric layer 12 can include a wurtzite crystal structure that includes aluminum nitride and silicon carbide. The piezoelectric layer 12 can include any of the material systems of Table 1. The material systems of Table 1 can each be wurtzite crystal structures. In the stoichiometric formulas of Table 1, $0<x<1$ and $0<y<0.5$. One or more additional elements and/or compounds can be included in a piezoelectric with any of the materials systems of Table 1 in some applications. Accordingly, the material systems of Table 1 can be starting lattices for a piezoelectric layer. In some instances, a piezoelectric layer can consist or consist essentially of material of any of the material systems of Table 1.

TABLE 1

| Material System | Stoichiometric Formula |
| --- | --- |
| AlN—SiC | $(Al_{1-x}Si_xN_{1-x}C_x)$ |
| AlN—SiC—C | $(Al_{1-x-y}Si_xN_{1-x}C_{x+y}$ to $Al_{1-x}Si_xN_{1-x-y}C_{x+y})$ |
|  | $Al_{1-x-y}Si_xN_{1-x-y}C_{x+2y}$ balanced C site occupation |
| AlN—SiC—BN | $(Al_{1-x-y}Si_xB_yN_{1-x}C_x)$ |
| AlN—SiC—BN—C | $(Al_{1-x-y-z}Si_xB_yN_{1-x}C_{x+z}$ to $Al_{1-x-y}Si_xB_yN_{1-x-z}C_{x+z})$ |
|  | $Al_{1-x-y-z}Si_xB_yN_{1-x-z}C_{x+2z}$ balanced C site occupation |
| AlN—SiC—ScN | $(Al_{1-x-y}Si_xSc_yN_{1-x}C_x)$ |
| AlN—SiC—ScN—C | $(Al_{1-x-y-z}Si_xSc_yN_{1-x}C_{x+z}$ to $Al_{1-x-y}Si_xSc_yN_{1-x-z}C_{x+z})$ |
|  | $Al_{1-x-y-z}Si_xSc_yN_{1-x-z}C_{x+2z}$ balanced C site occupation |
| AlN—SiC—1/2MgSiN$_2$ | $(Al_{1-x-2y}Si_{x+y}Mg_yN_{1-x}C_x)$ |
| AlN—SiC—1/2MgSiN$_2$—C | $(Al_{1-x-2y-z}Si_{x+y}Mg_yN_{1-x}C_{x+z}$ to $(Al_{1-x-2y}Si_{x+y}Mg_yN_{1-x-z}C_{x+z})$ |
|  | $Al_{1-x-2y-z}Si_{x+y}Mg_yN_{1-x-z}C_{x+2z}$ balanced C site occupation |

The piezoelectric layer 12 can include material in the AlN—SiC material system. The AlN—SiC material system can be a continuous solid solution. The piezoelectric layer 12 can include material in the AlN—SiC—C material system. The AlN—SiC—C material system adds carbon relative to the AlN—SiC material system. Carbon can be added on both sites. Carbon can be substituted for an anion or the cation site. $Al_4C_3$ formation is typically best to be avoided in the AlN—SiC—C material system.

The piezoelectric layer 12 can include material in the AlN—SiC—BN material system. The AlN—SiC—BN material system is a ternary system. The piezoelectric layer 12 can include material in the AlN—SiC—BN—C material system. The AlN—SiC—BN—C material system adds carbon relative to the AlN—SiC—BN material system. The piezoelectric layer 12 can include material in the AlN—SiC—BN—C—ScN material system. The AlN—SiC—BN—C—ScN material system adds ScN material relative to the AlN—SiC—BN—C material system.

The piezoelectric layer 12 can include material in the AlN—SiC—ScN material system. The Sc in the AlN—SiC—ScN material system can increase the electromechanical coupling coefficient $k^2$ where the material system can start with a higher acoustic velocity than AlN either with or without the Sc. The piezoelectric layer 12 can include material in the AlN—SiC—ScN—C material system. The AlN—SiC—ScN—C material system adds carbon relative to the AlN—SiC—ScN material system.

The piezoelectric layer 12 can include material in the AlN—SiC-½MgSiN$_2$ material system. The AlN—SiC-½MgSiN$_2$ material system is a coupled solution that adds Mg to increase the electromechanical coupling coefficient $k^2$ and uses excess Si to balance out charge. The piezoelectric layer 12 can include material in the AlN—SiC-½MgSiN$_2$—C material system. The AlN—SiC-½MgSiN$_2$—C material system adds carbon relative to the AlN—SiC-½MgSiN$_2$ material system. Carbon can be balanced to reduce or eliminate point defects associated with a charge imbalance on either site.

The piezoelectric layer 12 can include a wurtzite crystal structure that includes $Al_4SiC_4$. Wurtzite $Al_4SiC_4$ has piezoelectric properties that can be suitable for acoustic wave devices.

The piezoelectric layer 12 can include a wurtzite crystal structure that includes Al—B—N. Successful synthesis of Al—B—N films with up to 8% B has been achieved. From first principles, increased covalency in Al—B—N indicates increases in the elastic constant C33 and the acoustic velocity with increasing B. Decreased ionicity can lead to decreased e33 and $k^2$ with increasing B. The dielectric constant is expected to decrease with increasing B. In a piezoelectric layer with AlN, B substitutions can lead to high acoustic velocity, such as acoustic velocity of greater than 12,000 m/s.

The Al—B—N material system can have a stoichiometric formula of $B_xAl_{1-x}N$. In wurtzite $B_xAl_{1-x}N$, x and y can satisfy the following: $0.001<x<0.70$, $0.85<y<1.05$. The B additions can lead to greater hardness, higher acoustic velocity, and wider band gap than AlN film. In some instances, B additions can reduce the electromechanical coupling coefficient. A 33 mol % B solubility in AlN films has been reported. A unit cell volume can decrease. Lattice constants can decrease more than predicted by Vegard's law.

The piezoelectric layer 12 can include $BC_2N$ with the wurtzite crystal structure. No piezoelectric properties of $BC_2N$ alone have been reported. An additional element or compound can be included in addition to $BC_2N$ to make such a piezoelectric layer more strongly piezoelectric. $BC_2N$ has a wurtzite structure and can form a piezoelectric solid solution with AlN, AlN—SiC, or the like.

The first piezoelectric layer 12 can be doped with any suitable dopant, such as scandium (Sc), chromium (Cr), magnesium (Mg), sulfur (S), yttrium (Y), silicon (Si), germanium (Ge), oxygen (O), hafnium (Hf), zirconium (Zr), titanium (Ti), or the like. One or more of these dopants can be added to any suitable material system of Table 1 and/or any other piezoelectric layers with high acoustic velocity disclosed herein. Doping the piezoelectric layer 12 can adjust the resonant frequency. Doping the first piezoelectric layer 12 can increase the coupling coefficient $k^2$ of the BAW device 10. Doping to increase the coupling coefficient $k^2$ can be advantageous at higher frequencies where the coupling coefficient $k^2$ can be degraded.

In certain applications, two or more piezoelectric layers in accordance with any suitable principles and advantages disclosed herein can be stacked with each other between electrodes of a BAW device. The stacked piezoelectric layers can have c-axes oriented in opposite directions and excite an overtone mode as a main mode of a BAW resonator.

As illustrated in FIG. 1A, the BAW device 10 includes a support substrate 14, a trap rich layer 15, a first passivation layer 16, an air cavity 18, a first electrode 20, the piezoelectric layer 12, a second electrode 22, and a second passivation layer 24. The BAW device 10 also includes a recessed frame structure 27 and a raised frame structure 28.

The support substrate 14 can be a semiconductor substrate. The support substrate 14 can be a silicon substrate. The support substrate 14 can be any other suitable support substrate. The trap rich layer 15 can be a polysilicon layer, an amorphous silicon layer, or the like. The trap rich layer 15 is positioned between the support substrate 14 and the first passivation layer 16. The first passivation layer 16 can be referred to as a lower passivation layer. The first passivation layer 16 can be referred to as a bottom oxide layer when the lower passivation layer includes an oxide. The first passivation layer 16 can be a silicon dioxide layer or any other suitable passivation layer, such as aluminum oxide, silicon carbide, aluminum nitride, silicon nitride, silicon oxynitride, or the like.

The air cavity 18 is an example of an acoustic reflector. As illustrated, the air cavity 18 is located above the support substrate 14. The air cavity 18 is positioned between the support substrate 14 and the first electrode 20. In some applications, an air cavity can be etched into a support substrate. In certain applications, a solid acoustic mirror with alternating high acoustic impedance and low acoustic impedance layers can be included in place of an air cavity. A BAW device with an air cavity can be referred to as an FBAR. A BAW device with a solid acoustic mirror can be referred to as a BAW SMR.

The first electrode 20 can be referred to as a lower electrode. The first electrode 20 can have a relatively high acoustic impedance. The first electrode 20 can include molybdenum (Mo), tungsten (W), ruthenium (Ru), chromium (Cr), iridium (Jr), platinum (Pt), Ir/Pt, or any suitable alloy and/or combination thereof. Similarly, the second electrode 22 can have a relatively high acoustic impedance. The second electrode 22 can include Mo, W, Ru, Cr, Jr, Pt, Ir/Pt, or any suitable alloy and/or combination thereof. The second electrode 22 can be formed of the same material as the first electrode 20 in certain instances. The second electrode 22 can be referred to as an upper electrode. The thickness of the first electrode 20 can be approximately the same as the thickness of the second electrode 22 in a main acoustically active region of the BAW device 10. The first electrode 20 and the second electrode 22 can be the only electrodes of the BAW device 10.

The second passivation layer 24 can be referred to as an upper passivation layer. The second passivation layer 24 can be a silicon dioxide layer or any other suitable passivation layer, such as aluminum oxide, silicon carbide, aluminum nitride, silicon nitride, silicon oxynitride, or the like. The second passivation layer 24 can be the same material as the first passivation layer 15 in certain instances. The second passivation layer 24 can have different thicknesses in different regions of the BAW device 10. Part of the second passivation layer 24 can form at least part of the recessed frame structure 27 and/or the raised frame structure 28.

An active region or active domain of the BAW device 10 can be defined by a portion of the piezoelectric layer 12 that overlaps an acoustic reflector, such as the air cavity 18, and is between the first electrode 20 and the second electrode 22. The active region can correspond to where voltage is applied on opposing sides of the piezoelectric layer 12 over the acoustic reflector. The active region can be the acoustically active region of the BAW device 10. The BAW device 10 also includes a recessed frame region with the recessed frame structure 27 in the active region and a raised frame region with the raised frame structure 28 in the active region. The main acoustically active region can provide a main mode of the BAW device 10. The main acoustically active region can be the central part of the active region that is free from frame structures, such as the recessed frame structure 27 and the raised frame structure 28.

While the BAW device 10 includes the recessed frame structure 27 and the raised frame structure 28, other frame structures can alternatively or additionally be implemented. For example, a raised frame structure with multiple layers including a layer between an electrode of a BAW device and a piezoelectric layer can be implemented. As another example, a floating raised frame structure can be implemented. As one more example, a raised frame structure can be implemented without a recessed frame structure.

One or more conductive layers 30 and 32 can connect an electrode of the BAW device 10 to one or more other BAW devices, one or more integrated passive devices, one or more other circuit elements, one or more signal ports, the like, or any suitable combination thereof. An adhesion layer 34 can be positioned between the conductive layer 30 and an underlying layer to increase adhesion between the layers. The adhesion layer 34 can be a titanium layer, for example.

Figure 1B:
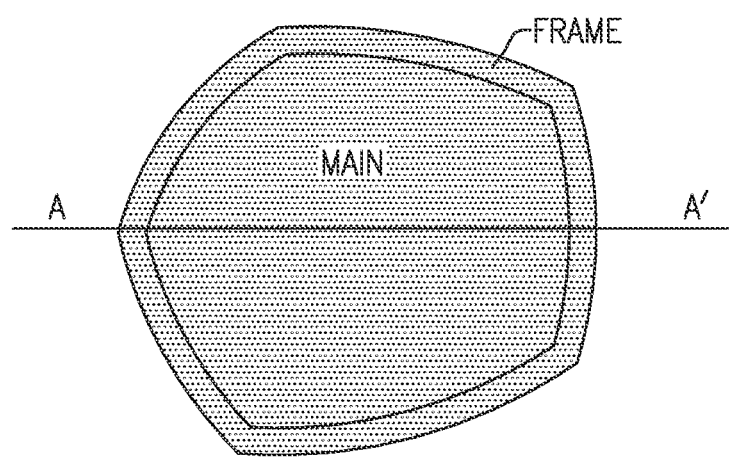
FIG. 1B is an example plan view of the BAW device of FIG. 1A.

FIG. 1B is an example plan view of the BAW device 10 of FIG. 1A. The cross-sectional view of FIG. 1A can be along the line from A to A' in FIG. 1B. In FIG. 1B, the frame region FRAME and the main acoustically active region MAIN are shown. As illustrated, the main acoustically active region MAIN can correspond be the majority of the area of the BAW device 10. The frame region FRAME includes the recessed frame structure 17 and the raised frame structure 18 of the BAW device 10 of FIG. 1A. FIG. 1B illustrates the BAW device 10 with a pentagon shape with curved sides in plan view. A BAW device in accordance with any suitable principles and advantages disclosed herein can have any other suitable shape in plan view, such as a semi-elliptical shape, a semi-circular shape, a circular shape, an ellipsoid shape, a quadrilateral shape, or a quadrilateral shape with curved sides.

The piezoelectric layers disclosed herein can be implemented in SAW devices. A saw device can be a SAW resonator, a multi-mode SAW filter with longitudinally coupled interdigital transducer electrodes positioned between acoustic reflectors, a SAW delay line, or the like. In SAW devices, a piezoelectric layer having a higher acoustic velocity can allow interdigital transducer (IDT) electrode pitch to be greater than for a lower acoustic velocity piezoelectric layer SAW device with the same resonant frequency. A high acoustic velocity piezoelectric layer can make SAW devices easier to manufacture with larger pitches. Alternatively, a SAW device with a higher acoustic velocity piezoelectric layer can have a higher resonant frequency than as another SAW device with a lower acoustic velocity material and the same IDT pitch. TCSAW resonators, non-temperature compensated SAW resonators, and/or MPS SAW resonators can include piezoelectric layers in accordance with any suitable principles and advantages disclosed herein. Examples of such SAW device will be discussed with reference to FIGS. 2A to 4.

Figure 2A:
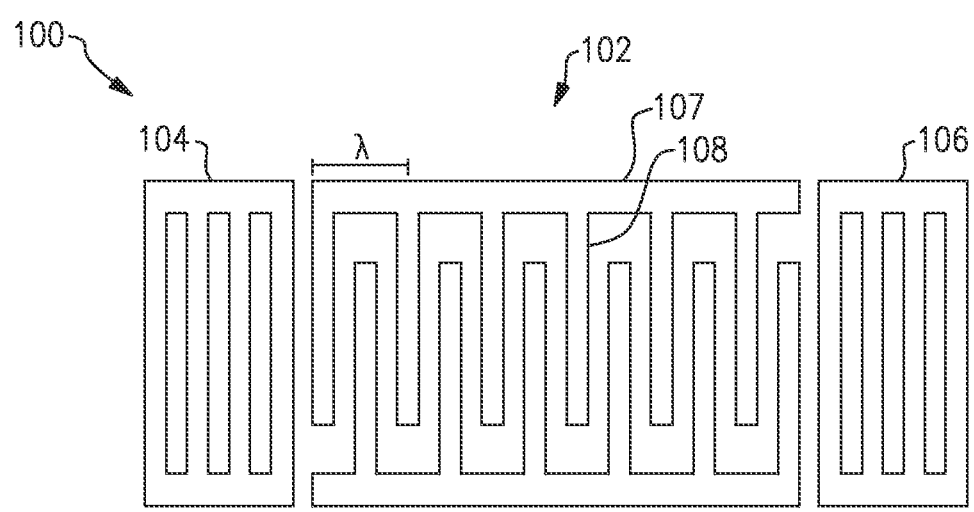
FIG. 2A is a top view of an interdigital transducer (IDT) electrode of a surface acoustic wave (SAW) device according to an embodiment.
Figure 2B:
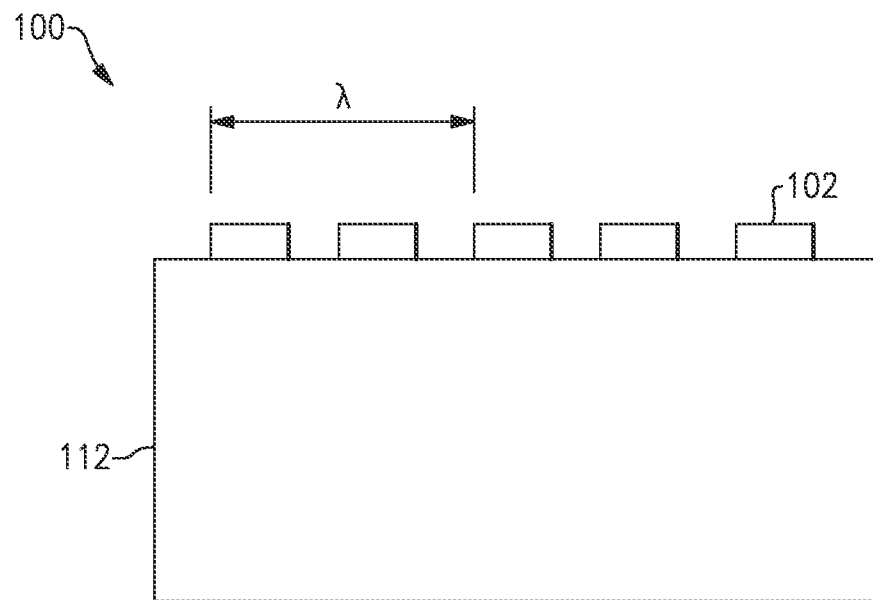
FIG. 2B is a cross-sectional view of the SAW device of FIG. 2A.

FIG. 2A is a top view of an interdigital transducer (IDT) electrode 102 of a SAW device 100. FIG. 2B is a cross-sectional view of the SAW device 100 of FIG. 2A. The IDT electrode 102 is positioned between a first acoustic reflector 104 and a second acoustic reflector 106. The acoustic reflectors 104 and 106 are separated from the IDT electrode 102 by respective gaps. The IDT electrode 102 includes the bus bar 107 and IDT fingers 108 extending from the bus bar 107. The IDT fingers 108 have a pitch of $\lambda$. The SAW device 100 can include any suitable number of IDT fingers 108. The pitch $\lambda$ of the IDT fingers 108 corresponds to wavelength of a surface acoustic wave generated by the SAW device 100.

The SAW device 100 illustrated in FIG. 2B includes a piezoelectric layer 112 and an IDT electrode 102 on the piezoelectric layer 112. The piezoelectric layer 112 can be implemented in accordance with any suitable principles and advantages disclosed herein. The IDT electrode 102 can include any suitable material for an electrode, such as tungsten, aluminum, molybdenum, the like, or any suitable combination or alloy thereof. In some instances, the IDT electrode can include two or more metal layers. The SAW device 100 can included in a filter in accordance with any suitable principles and advantages disclosed herein.

Figure 3:
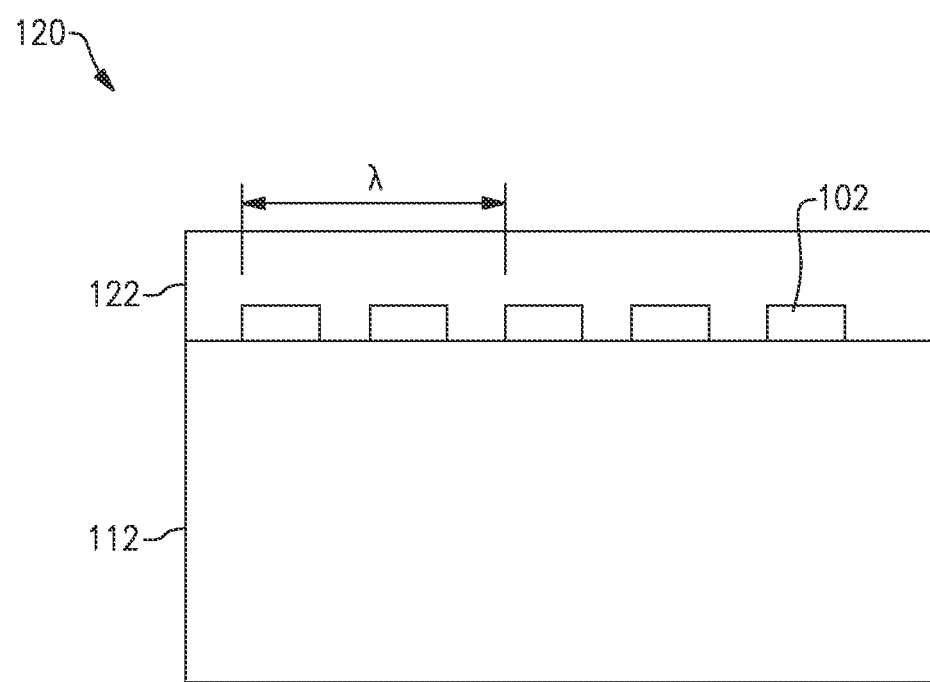
FIG. 3 is a cross-sectional view of a temperature compensated SAW (TCSAW) device according to an embodiment.

FIG. 3 is a cross-sectional view of a TCSAW device 120. The illustrated TCSAW device 120 includes a piezoelectric layer 112, an IDT electrode 102 on the piezoelectric layer 112, and a temperature compensation layer 122 over the IDT electrode 102. The TCSAW device 120 is like the SAW device 100, except that the TCSAW device 120 includes a temperature compensation layer 122 over the IDT electrode 102. The piezoelectric layer 112 of the TCSAW device 120 can be implemented in accordance with any suitable principles and advantages disclosed herein.

The temperature compensation layer 122 can bring the temperature coefficient of frequency (TCF) of the TCSAW device 120 closer to zero relative to a similar SAW device without the temperature compensation layer 122. The temperature compensation layer 122 can have a positive TCF. This can compensate for the piezoelectric layer 112 having a negative TCF. The temperature compensation layer 122 can be a silicon dioxide ($SiO_2$) layer. The temperature compensation layer 122 can include any other suitable temperature compensating material including without limitation a tellurium dioxide ($TeO_2$) layer or a silicon oxyfluoride (SiOF layer). The temperature compensation layer 122 can include any suitable combination of $SiO_2$, $TeO_2$, and/or SiOF.

Figure 4:
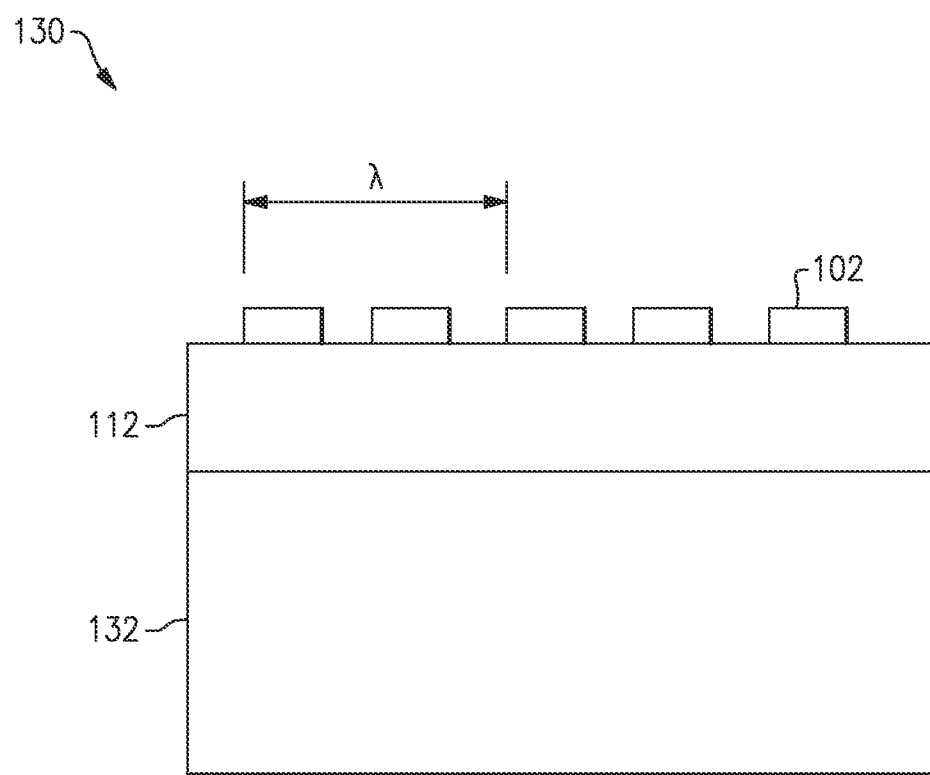
FIG. 4 is a cross-sectional view of a multiplayer piezoelectric substrate (MPS) SAW device according to an embodiment.

FIG. 4 is a cross-sectional view of an MPS SAW device 130. The illustrated MPS SAW device 130 includes a multilayer piezoelectric substrate including a piezoelectric layer 112 and a support substrate 132. The MPS SAW device 130 also includes an IDT electrode 102 on the piezoelectric layer 112. The MPS SAW device 130 is like the SAW device 100, except that the MPS SAW device 130 includes the support substrate 132. In certain applications, the piezoelectric layer 112 can be thinner in the MPS SAW device 130 compared to in the SAW device 100. For example, the piezoelectric layer 112 can have a thickness of less than $\lambda$ in the MPS SAW device 130, in which $\lambda$ is a wavelength of a surface acoustic wave generated by the MPS SAW device 130. In some other instances, the piezoelectric layer 112 can have a thickness on the order of 10s of $\lambda$, in which $\lambda$ is a wavelength of a surface acoustic wave generated by the MPS SAW device 130. The piezoelectric layer 112 of the MPS SAW device 130 can be implemented in accordance with any suitable principles and advantages disclosed herein.

The support substrate 132 can be a silicon substrate, a quartz substrate, a sapphire substrate, a polycrystalline spinel substrate, or any other suitable carrier substrate. As one example, the MPS SAW device 130 can include a support substrate 132 that is silicon.

In some instances (not illustrated), one or more additional layers can be included in the multilayer piezoelectric substrate of an MPS SAW device. Non-limiting examples of a layer of the one or more additional layers include a silicon dioxide layer, a silicon nitride layer, an aluminum nitride layer, an adhesion layer, a dispersion adjustment layer, and a thermal dissipation layer. As an illustrative example, a multilayer piezoelectric substrate can include a piezoelectric layer over a silicon dioxide layer over an aluminum nitride layer over a silicon layer. As one more illustrative example, a multilayer piezoelectric substrate can include a piezoelectric layer over a silicon dioxide layer over a high impedance layer, in which the high impedance layer has a higher acoustic impedance than the piezoelectric. In some instances (not illustrated), a temperature compensation layer can be included over an IDT electrode of an MPS SAW device.

Acoustic wave devices disclosed herein can be implemented as acoustic wave resonators in a variety of filters. Such filters can be arranged to filter a radio frequency signal. Acoustic wave devices disclosed herein can be implemented in a variety of different filter topologies. Example filter topologies include without limitation, ladder filters, lattice filters, hybrid ladder lattice filters, notch filters where a notch is created by an acoustic wave resonator, hybrid acoustic and non-acoustic inductor-capacitor filters, and the like. The example filter topologies can implement band pass filters. The example filter topologies can implement band stop filters. In some instances, acoustic wave devices disclosed herein can be implemented in filters with one or more other types of resonators and/or with passive impedance elements, such as one or more inductors and/or one or more capacitors. An example filter topology will be discussed with reference to FIG. 5A.

Figure 5A:
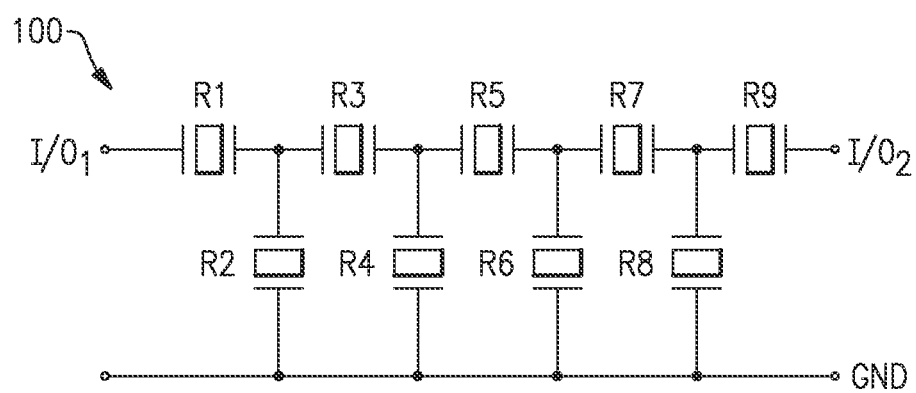
FIG. 5A is a schematic diagram of a ladder filter that includes an acoustic wave resonator according to an embodiment.

FIG. 5A is a schematic diagram of a ladder filter 150 that includes an acoustic wave resonator according to an embodiment. The ladder filter 150 is an example topology that can implement a band pass filter formed of acoustic wave resonators. In a band pass filter with a ladder filter topology, the shunt resonators can have lower resonant frequencies than the series resonators. The ladder filter 150 can be arranged to filter a radio frequency signal. As illustrated, the ladder filter 150 includes series acoustic wave resonators R1 R3, R5, R7, and R9 and shunt acoustic wave resonators R2, R4, R6, and R8 coupled between a first input/output port $I/O_1$ and a second input/output port $I/O_2$. Any suitable number of series acoustic wave resonators can be in included in a ladder filter. Any suitable number of shunt acoustic wave resonators can be included in a ladder filter. The first input/output port $I/O_1$ can be a transmit port and the second input/output port $I/O_2$ can be an antenna port. Alternatively, first input/output port $I/O_1$ can be a receive port and the second input/output port $I/O_2$ can be an antenna port. One or more of the acoustic wave resonators of the ladder filter 150 can include an acoustic wave device including a piezoelectric layer in accordance with any suitable principles and advantages disclosed herein. All acoustic resonators of the ladder filter 150 can include a piezoelectric layer in accordance with any suitable principles and advantages disclosed herein.

A filter that includes an acoustic wave resonator in accordance with any suitable principles and advantages disclosed herein be arranged to filter a radio frequency signal in a fifth generation 5G NR operating band within Frequency Range 1 (FR1). FR1 can be from 410 MHz to 7.125 gigahertz (GHz), for example, as specified in a current 5G NR specification. A filter that an acoustic wave resonator in accordance with any suitable principles and advantages disclosed herein can be arranged to filter a radio frequency signal in a fourth generation (4G) Long Term Evolution (LTE) operating band. A filter that includes an acoustic wave resonator in accordance with any suitable principles and advantages disclosed herein can be included in a filter having a passband that includes a 4G LTE operating band and a 5G NR operating band. Such a filter can be implemented in a dual connectivity application, such as an E-UTRAN New Radio-Dual Connectivity (ENDC) application. A multiplexer including any such filters can include one or more other filters with a passband corresponding to a 5G NR operating band and/or a 4G LTE operating band.

The high acoustic velocity of piezoelectric layers disclosed herein can be advantageous for implementing BAW devices with relatively high resonant frequencies. This can be advantageous in acoustic wave filters for 5G applications. Yields of BAW resonators with relatively high resonant frequencies (e.g., resonant frequencies of at least 6 GHz) can be improved with piezoelectric layers disclosed herein. For example, BAW resonators with a resonant frequency of about 10 GHz can be achieved with piezoelectric layers disclosed herein at reasonable yields. The lower power density of piezoelectric layers disclosed herein compared to AlN piezoelectric layers can be advantageous in relatively high power applications, such as certain 5G applications. Strain in BAW devices can be reduced with piezoelectric layers disclosed herein.

Figure 5B:
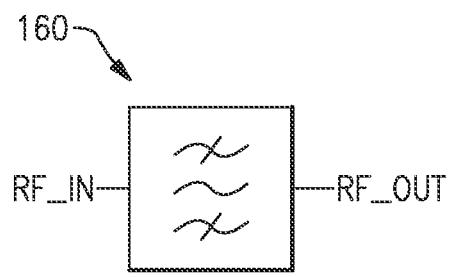
FIG. 5B is schematic diagram of an acoustic wave filter.

FIG. 5B is schematic diagram of an acoustic wave filter 160. The acoustic wave filter 160 can include the acoustic wave resonators of the ladder filter 150. The acoustic wave filter 160 is a band pass filter. The acoustic wave filter 160 is arranged to filter a radio frequency signal. The acoustic wave filter 160 includes one or more acoustic wave devices coupled between a first input/output port RF_IN and a second input/output port RF OUT. The acoustic wave filter 160 includes an acoustic wave resonator according to an embodiment.

The acoustic wave device disclosed herein can be implemented in a standalone filter and/or in a filter of any suitable multiplexer. Such filters can be any suitable topology, such as a ladder filter topology. The filter can be a band pass filter arranged to filter a 4G LTE band and/or 5G NR band. Example multiplexer will be discussed with reference to FIGS. 6A to 6D. Any suitable principles and advantages of these multiplexers can be implemented together with each other.

Figure 6A:
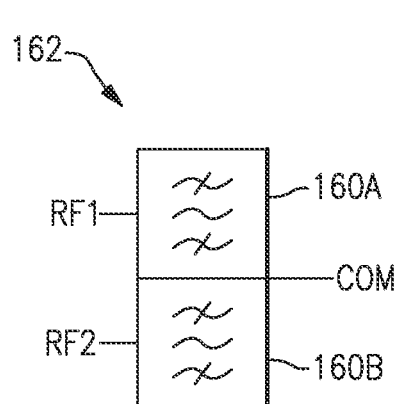
FIGS. 6A, 6B, 6C, and 6D are schematic diagrams of multiplexers that includes an acoustic wave resonator according to an embodiment.

FIG. 6A is a schematic diagram of a duplexer 162 that includes an acoustic wave filter according to an embodiment. The duplexer 162 includes a first filter 160A and a second filter 160B coupled to together at a common node COM. One of the filters of the duplexer 162 can be a transmit filter and the other of the filters of the duplexer 162 can be a receive filter. In some other instances, such as in a diversity receive application, the duplexer 162 can include two receive filters. Alternatively, the duplexer 162 can include two transmit filters. The common node COM can be an antenna node.

The first filter 160A is an acoustic wave filter arranged to filter a radio frequency signal. The first filter 160A includes one or more acoustic wave resonators coupled between a first radio frequency node RF1 and the common node COM. The first radio frequency node RF1 can be a transmit node or a receive node. The first filter 160A includes an acoustic wave resonator in accordance with any suitable principles and advantages disclosed herein.

The second filter 160B can be any suitable filter arranged to filter a second radio frequency signal. The second filter 160B can be, for example, an acoustic wave filter, an acoustic wave filter that includes an acoustic wave resonator with a piezoelectric layer having a high acoustic velocity, an LC filter, a hybrid acoustic wave LC filter, or the like. The second filter 160B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implement in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of acoustic wave devices in accordance with any suitable principles and advantages disclosed herein.

Figure 6C:
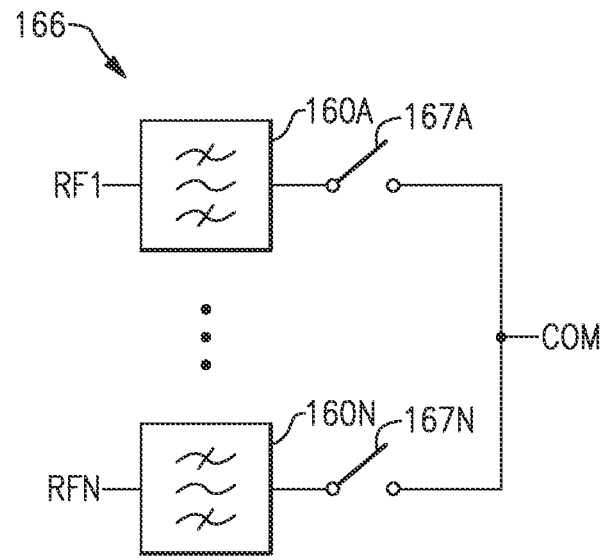
Figure 6B:
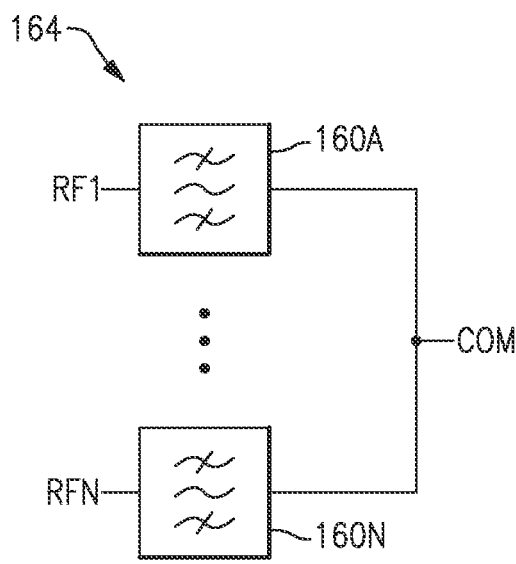

FIG. 6B is a schematic diagram of a multiplexer 164 that includes an acoustic wave filter according to an embodiment. The multiplexer 164 includes a plurality of filters 160A to 160N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 160A to 160N each have a fixed electrical connection to the common node COM. This can be referred to as hard multiplexing or fixed multiplexing. Filters have fixed electrical connections to the common node in hard multiplexing applications.

The first filter 160A is an acoustic wave filter arranged to filter a radio frequency signal. The first filter 160A can include one or more acoustic wave devices coupled between a first radio frequency node RF1 and the common node COM. The first radio frequency node RF1 can be a transmit node or a receive node. The first filter 160A includes an acoustic wave resonator in accordance with any suitable principles and advantages disclosed herein. The other filter(s) of the multiplexer 164 can include one or more acoustic wave filters, one or more acoustic wave filters that include an acoustic wave resonator in accordance with any suitable principles and advantages disclosed herein, one or more LC filters, one or more hybrid acoustic wave LC filters, the like, or any suitable combination thereof.

FIG. 6C is a schematic diagram of a multiplexer 166 that includes an acoustic wave filter according to an embodiment. The multiplexer 166 is like the multiplexer 164 of FIG. 6B, except that the multiplexer 166 implements switched multiplexing. In switched multiplexing, a filter is coupled to a common node via a switch. In the multiplexer 166, the switches 167A to 167N can selectively electrically connect respective filters 160A to 160N to the common node COM. For example, the switch 167A can selectively electrically connect the first filter 160A the common node COM via the switch 167A. Any suitable number of the switches 167A to 167N can electrically a respective filter 160A to 160N to the common node COM in a given state. Similarly, any suitable number of the switches 167A to 167N can electrically isolate a respective filter 160A to 160N to the common node COM in a given state. The functionality of the switches 167A to 167N can support various carrier aggregations.

Figure 6D:
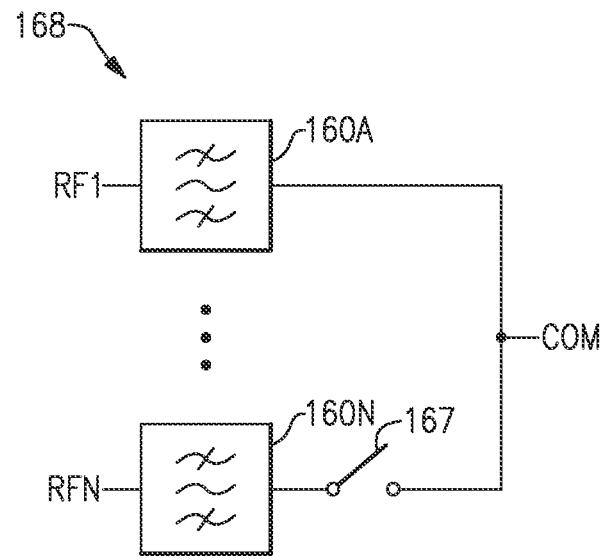

FIG. 6D is a schematic diagram of a multiplexer 168 that includes an acoustic wave filter according to an embodiment. The multiplexer 168 illustrates that a multiplexer can include any suitable combination of hard multiplexed and switched multiplexed filters. One or more acoustic wave devices in accordance with any suitable principles and advantages disclosed herein can be included in a filter (e.g., the filter 160A) that is hard multiplexed to the common node COM of the multiplexer 168. Alternatively or additionally, one or more acoustic wave devices in accordance with any suitable principles and advantages disclosed herein can be included in a filter (e.g., the filter 160N) that is switch multiplexed to the common node COM of the multiplexer 168.

Figure 7:
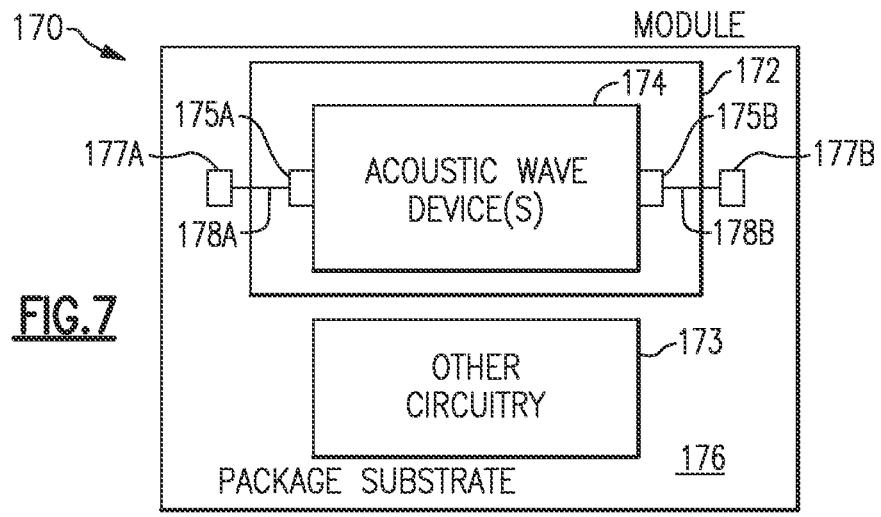
FIGS. 7, 8, and 9 are schematic block diagrams of modules that include a filter with an acoustic wave device according to an embodiment.
Figure 8:
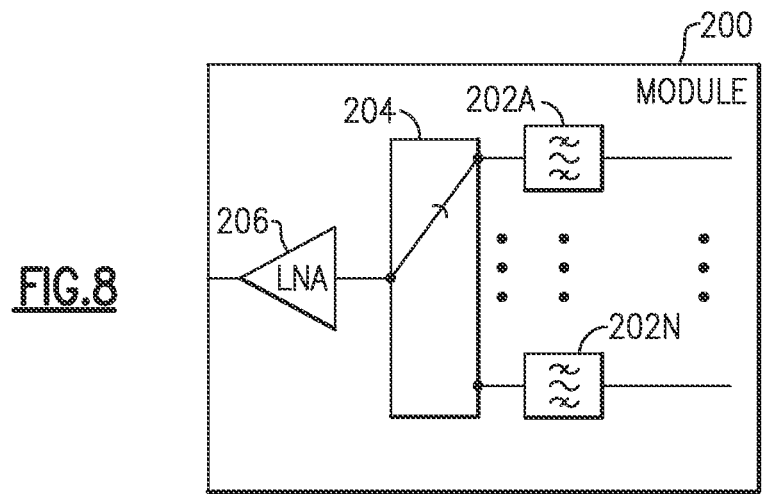
Figure 9:
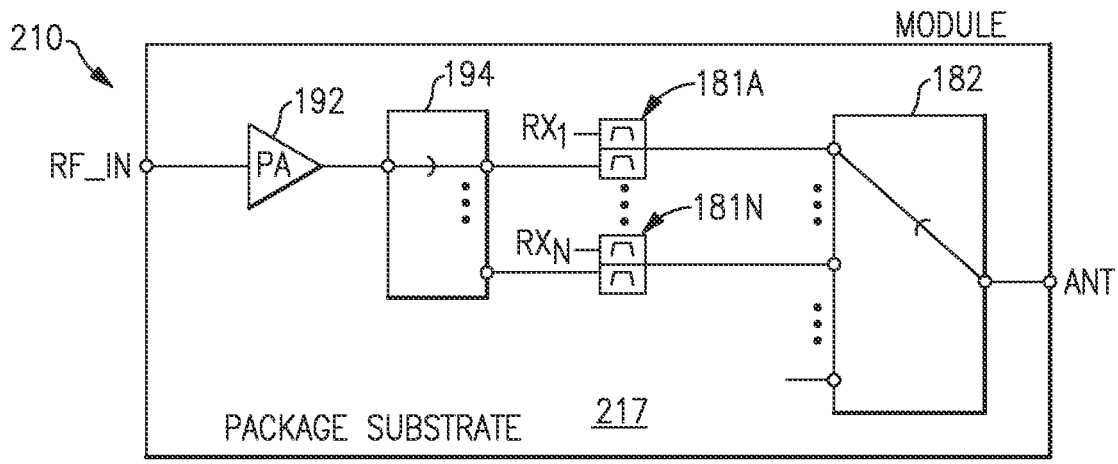

Acoustic wave devices disclosed herein can be implemented in a variety of packaged modules. Some example packaged modules will now be disclosed in which any suitable principles and advantages of the acoustic wave devices disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 7 to 9 are schematic block diagrams of illustrative packaged modules according to certain embodiments. Any suitable combination of features of these packaged modules can be implemented with each other.

FIG. 7 is a schematic diagram of a radio frequency module 170 that includes an acoustic wave component 172 according to an embodiment. The illustrated radio frequency module 170 includes the acoustic wave component 172 and other circuitry 173. The acoustic wave component 172 can include an acoustic wave filter that includes a plurality of acoustic wave devices, for example. The acoustic wave devices can be BAW devices in certain applications.

The acoustic wave component 172 shown in FIG. 7 includes one or more acoustic wave devices 174 and terminals 175A and 175B. The one or more acoustic wave devices 174 include at least one acoustic wave device implemented in accordance with any suitable principles and advantages disclosed herein. The terminals 175A and 174B can serve, for example, as an input contact and an output contact. Although two terminals are illustrated, any suitable number of terminals can be implemented for a particular application. The acoustic wave component 172 and the other circuitry 173 are on a common packaging substrate 176 in FIG. 7. The packaging substrate 176 can be a laminate substrate. The terminals 175A and 175B can be electrically connected to contacts 177A and 177B, respectively, on the packaging substrate 176 by way of electrical connectors 178A and 178B, respectively. The electrical connectors 178A and 178B can be bumps or wire bonds, for example.

The other circuitry 173 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. Accordingly, the other circuitry 173 can include one or more radio frequency circuit elements. The other circuitry 173 can be electrically connected to the one or more acoustic wave devices 174. The radio frequency module 170 can include one or more packaging structures to, for example, provide protection and/or facilitate easier handling of the radio frequency module 170. Such a packaging structure can include an overmold structure formed over the packaging substrate 176. The overmold structure can encapsulate some or all of the components of the radio frequency module 170.

FIG. 8 is a schematic block diagram of a module 200 that includes filters 202A to 202N, a radio frequency switch 204, and a low noise amplifier 206 according to an embodiment. One or more filters of the filters 202A to 202N can include any suitable number of bulk acoustic wave devices in accordance with any suitable principles and advantages disclosed herein. Any suitable number of filters 202A to 202N can be implemented. The illustrated filters 202A to 202N are receive filters. One or more of the filters 202A to 202N can be included in a multiplexer that also includes a transmit filter and/or another receive filter. The radio frequency switch 204 can be a multi-throw radio frequency switch. The radio frequency switch 204 can electrically couple an output of a selected filter of filters 202A to 202N to the low noise amplifier 206. In some embodiments, a plurality of low noise amplifiers can be implemented. The module 200 can include diversity receive features in certain applications.

FIG. 9 is a schematic diagram of a radio frequency module 210 that includes an acoustic wave filter according to an embodiment. As illustrated, the radio frequency module 210 includes duplexers 181A to 181N, a power amplifier 192, a radio frequency switch 194 configured as a select switch, and an antenna switch 182. The radio frequency module 210 can include a package that encloses the illustrated elements. The illustrated elements can be disposed on a common packaging substrate 217. The packaging substrate 217 can be a laminate substrate, for example. A radio frequency module that includes a power amplifier can be referred to as a power amplifier module. A radio frequency module can include a subset of the elements illustrated in FIG. 9 and/or additional elements. The radio frequency module 210 may include any one of the acoustic wave filters that include at least one bulk acoustic wave resonator in accordance with any suitable principles and advantages disclosed herein.

The duplexers 181A to 181N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include an acoustic wave device in accordance with any suitable principles and advantages disclosed herein. Similarly, one or more of the receive filters can include an acoustic wave device in accordance with any suitable principles and advantages disclosed herein. Although FIG. 9 illustrates duplexers, any suitable principles and advantages disclosed herein can be implemented in other multiplexers (e.g., quadplexers, hexaplexers, octoplexers, etc.) and/or in switched multiplexers and/or with standalone filters.

The power amplifier 192 can amplify a radio frequency signal. The illustrated radio frequency switch 194 is a multi-throw radio frequency switch. The radio frequency switch 194 can electrically couple an output of the power amplifier 192 to a selected transmit filter of the transmit filters of the duplexers 181A to 181N. In some instances, the radio frequency switch 194 can electrically connect the output of the power amplifier 192 to more than one of the transmit filters. The antenna switch 182 can selectively couple a signal from one or more of the duplexers 181A to 181N to an antenna port ANT. The duplexers 181A to 181N can be associated with different frequency bands and/or different modes of operation (e.g., different power modes, different signaling modes, etc.).

Figure 10:
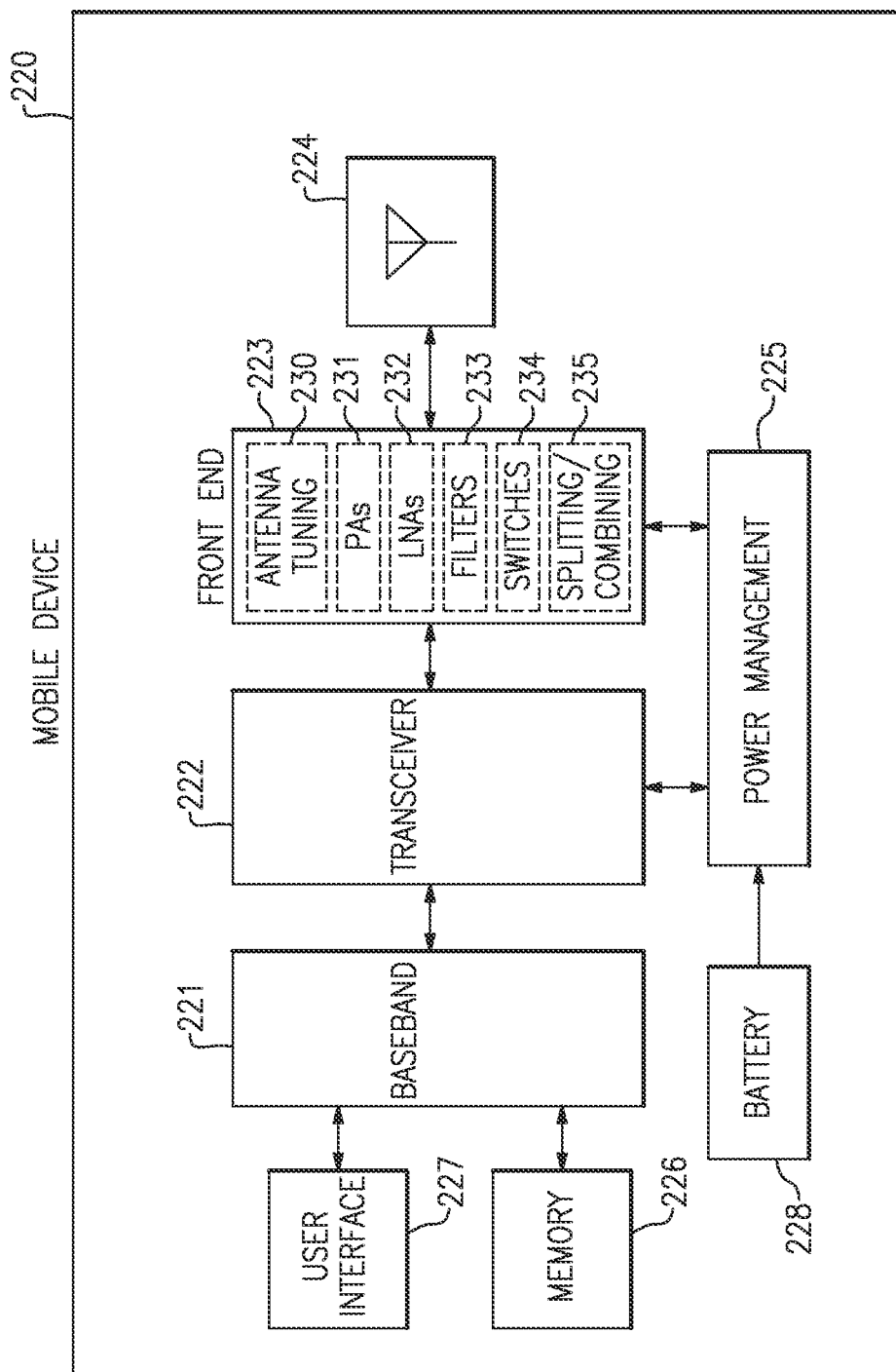
FIG. 10 is a schematic block diagram of a wireless communication device that includes a filter with an acoustic wave device according to an embodiment.

The acoustic wave devices disclosed herein can be implemented in wireless communication devices. FIG. 10 is a schematic block diagram of a wireless communication device 220 that includes an acoustic wave device according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 10 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAs) 231, low noise amplifiers (LNAs) 232, filters 233, switches 234, and signal splitting/combining circuitry 235. However, other implementations are possible. The filters 233 can include one or more acoustic wave filters that include any suitable number of acoustic wave devices in accordance with any suitable principles and advantages disclosed herein.

For example, the front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (I/O), such as voice and data. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 10, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 10, the power management system 225 receives a battery voltage from the battery 228. The battery 228 can be any suitable battery for use in the wireless communication device 220, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz, in FR1, in a frequency range from about 2 GHz to 10 GHz, in a frequency range from about 2 GHz to 15 GHz, or in a frequency range from 5 GHz to 20 GHz Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions, and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
   electrodes including a first electrode and a second electrode;
   a piezoelectric layer positioned between the first electrode and the second electrode, the piezoelectric layer including a wurtzite structure that includes carbon, the piezoelectric layer having an acoustic velocity of at least 10,000 meters per second; and
   an air cavity configured as an acoustic reflector, the acoustic wave device being a bulk acoustic wave device configured to generate a bulk acoustic wave, the bulk acoustic wave device having a resonant frequency of at least 6 gigahertz.

2. The acoustic wave device of claim 1 wherein the wurtzite structure further includes aluminum nitride.

3. The acoustic wave device of claim 1 wherein the wurtzite structure includes a carbide, and the carbon is included in the carbide.

4. The acoustic wave device of claim 1 wherein the wurtzite structure includes silicon carbide, and the carbon is included in the silicon carbide.

5. The acoustic wave device of claim 4 wherein the piezoelectric layer includes $Al_4SiC_4$.

6. The acoustic wave device of claim 1 wherein the wurtzite structure includes boron.

7. The acoustic wave device of claim 1 wherein the piezoelectric layer includes a dopant.

8. The acoustic wave device of claim 1 wherein the acoustic velocity is no greater than 15,000 meters per second.

9. The acoustic wave device of claim 1 wherein the resonant frequency is in a range from 6 gigahertz to 15 gigahertz.

10. The acoustic wave device of claim 1 wherein the acoustic velocity is at least 11,000 meters per second.

11. An acoustic wave device comprising:
a piezoelectric layer including a wurtzite structure and having an acoustic velocity of at least 10,000 meters per second, the piezoelectric layer including $Al_4SiC_4$; and
an electrode over the piezoelectric layer, the acoustic wave device configured to generate an acoustic wave.

12. The acoustic wave device of claim 11 wherein the acoustic velocity is no greater than 15,000 meters per second.

13. The acoustic wave device of claim 11 wherein the acoustic wave device is a bulk acoustic wave device, and the acoustic wave is a bulk acoustic wave.

14. The acoustic wave device of claim 13 wherein the bulk acoustic wave device has a resonant frequency in a range from 6 gigahertz to 15 gigahertz.

15. An acoustic wave filter comprising:
a bulk acoustic wave resonator including a piezoelectric layer including a wurtzite structure that includes carbon, the piezoelectric layer having an acoustic velocity of at least 10,000 meters per second, the bulk acoustic wave resonator having a resonant frequency of at least 6 gigahertz; and
a plurality of additional acoustic wave resonators, the acoustic wave filter configured to filter a radio frequency signal.

16. The acoustic wave filter of claim 15 wherein the wurtzite structure includes aluminum nitride.

17. The acoustic wave filter of claim 15 wherein the wurtzite structure includes silicon carbide, and the carbon is included in the silicon carbide.

18. The acoustic wave filter of claim 15 wherein the resonant frequency is in a range from 6 gigahertz to 15 gigahertz.

19. The acoustic wave filter of claim 15 wherein the acoustic velocity is no greater than 15,000 meters per second.

20. A wireless communication device comprising:
the acoustic wave filter of claim 15;
an antenna operatively coupled to the acoustic wave filter;
a radio frequency amplifier operatively coupled to the acoustic wave filter and configured to amplify a radio frequency signal; and
a transceiver in communication with the radio frequency amplifier.

* * * * *